United States Patent [19]

Yamamoto et al.

[11] Patent Number: 4,608,509

[45] Date of Patent: Aug. 26, 1986

[54] LENGTH POLARIZED, END ELECTRODED PIEZOELECTRIC RESONATOR

[76] Inventors: Takashi Yamamoto, Ro 118, Azayamazaki, Oshimizu-machi, Hakui-gun, Ishikawa, Japan, 929-13; Houdo Kitajima, 5-3 Hakkin-cho, Takaoka-shi, Toyama, Japan, 933; Hiroyuki Takahashi, 8-40 Fushikikofu 3-chome, Takaoka-shi, Toyama, Japan, 933-01

[21] Appl. No.: 675,394

[22] Filed: Nov. 27, 1984

[30] Foreign Application Priority Data

Dec. 8, 1983 [JP] Japan ............................... 58-232496

[51] Int. Cl.$^4$ ........................................... H01L 41/08
[52] U.S. Cl. ..................................... 310/357; 310/352; 310/354; 310/364; 310/365; 310/344
[58] Field of Search ............... 310/340, 344, 348, 351, 310/352, 353, 363–366, 357, 360, 361, 368, 358, 359, 354–356

[56] References Cited

U.S. PATENT DOCUMENTS

| 2,443,700 | 6/1948 | Sylvester et al. | 310/353 |
| 3,851,193 | 11/1974 | Ritter | 310/352 |
| 4,339,683 | 7/1982 | Scott et al. | 310/364 |

FOREIGN PATENT DOCUMENTS

| 2626708 | 1/1977 | Fed. Rep. of Germany | 310/352 |
| 2732972 | 7/1978 | Fed. Rep. of Germany | 310/353 |
| 2343366 | 9/1977 | France | 310/352 |
| 0077692 | 6/1977 | Japan | 310/351 |

Primary Examiner—Mark O. Budd
Attorney, Agent, or Firm—Wenderoth, Lind & Ponack

[57] ABSTRACT

A piezoelectric resonator utilizing the longitudinal vibration mode of piezoelectric ceramics. Exciting electrodes are formed on the lengthwise opposite end surface of the piezoelectric ceramic. Lengthwise extending surfaces of the piezoelectric ceramic are formed with insulating layers. A pair of take-out electrodes are provided which cover the insulating layers and which are connected to the exciting electrodes.

12 Claims, 24 Drawing Figures

LENGTH POLARIZED, END ELECTRODED PIEZOELECTRIC RESONATOR

BACKGROUND OF THE INVENTION

1. Field of the Invention

This invention relates to a piezoelectric resonator utilizing the longitudinal vibration mode and to a construction for a piezoelectric resonance part having said piezoelectric resonator packaged therein.

2. Description of the Prior Art

Heretofore, in a frequency region of 200–800 KHz, a piezoelectric resonator in the form of a quadrangular or circular plate utilizing expansive vibration has been used. The size of the piezoelectric resonators differs with intended frequency. The length l of one side of a quadrangular one and the radius R of a circular one are determined by dividing a: frequency constant by the intended frequency. The thickness t of the element is fixed so that $0.03l(R) < t < 0.2l(R)$. The use in the range of 200–800 KHz is due largely to problems of economics and of processing accuracy.

FIG. 1 is a sectional view showing an example of a conventional piezoelectric resonance part having this type of piezoelectric resonator housed therein. Opposite surfaces of a piezoelectric ceramic 1 are formed with electrodes 2 and 3, forming a piezoelectric resonator. Spring terminals 4 and 5 are connected to the middle portions of the electrodes 2 and 3 of this piezoelectric resonator where the vibratory displacement is relatively small, said spring terminals 4 and 5 being led out of a case 6. In addition, reference numeral 7 denotes a sealing resin.

It has been pointed out that the aforesaid conventional piezoelectric resonator and piezoelectric resonance part present various problems to be described below.

In a frequency region close to 200 KHz, the aforesaid length l or radius R becomes about 11 mm, a value which means a considerably large-sized and expensive article. Moreover, since the electrodes 2 and 3 make point contact with the terminals 4 and 5, even a slight shock can cause damage thereto.

On the other hand, in a frequency region close to 800 KHz, the length l or radius R is about 2.5 mm, which means a very small size, but this small size results in the points of contact of the metal terminals 4 and 5 with the electrodes 2 and 3 deviating from the middle where the vibratory displacement of the resonator is small, thus presenting a problem that a variation in electric characteristics is liable to occur.

Further, in the package construction of the conventional piezoelectric resonance part shown in FIG. 1, the entire configuration is large and the size of the resonator varies considerably with intended frequency, so that uniformity of the shape of cases cannot be attained; thus, cases of various sizes and shapes are required. Similarly, since the base board size of the resonator changes with intended frequency, not only the cases but also other parts such as terminals must be designed and manufactured individually according to intended frequencies. Further, the leads to be led out of the case must be prepared in various pitches, lacking in interchangeability and making it difficult to reduce cost. Further, the construction of FIG. 1, which is employed to enable the resonator to vibrate freely in the case, requires a relatively large number of assembling steps, leading to a reduction in efficiency of production.

SUMMARY OF THE INVENTION

Accordingly, this invention is intended to provide a small-sized piezoelectric resonator and a piezoelectric resonance part using said piezoelectric resonator, which eliminate all of the aforesaid problems, that is, which are highly resistant to mechanical shock, have stability of electric characteristics and can be efficiently produced.

This invention, in brief, is a piezoelectric resonator utilizing the longitudinal vibration mode, comprising a piezoelectric body, exciting electrodes formed on lengthwise opposite end surfaces of said piezoelectric body, insulating layers formed on at least portions of lengthwise extending surfaces of said piezoelectric body, and a pair of electrodes covering at least portions of said insulating layers and connected to the exciting electrodes; and a piezoelectric resonance part having said piezoelectric resonator received in a case, with a pair of leads connected to a pair of take-out electrodes substantially at the middles of lengthwise extending surfaces of said piezoelectric resonator, said leads being led out of the case.

According to this invention, a piezoelectric resonator utilizing the longitudinal vibration mode, comprises a piezoelectric body, exciting electrodes formed on the lengthwise opposite end surfaces of said piezoelectric body, insulating layers formed on at least portions of lengthwise extending surfaces of said piezoelectric body, and a pair of take-out electrodes covering at least portions of said insulating layers and connected to the exciting electrodes. Thus, it is possible to obtain a piezoelectric resonator which is small in size and superior in shock resistance and stability of characteristics and capable of effectively suppressing spurious components. Further, the piezoelectric resonance part of this invention comprises said piezoelectric resonator, a case housing said piezoelectric resonator, and a pair of leads connected to the pair of exciting electrodes of the piezoelectric resonator at substantially the middles of lengthwise extending surfaces of said piezoelectric resonator, said leads being led out of the case. Even in instances where piezoelectric resonators for different intended frequencies are used, the same case and leads can be used. Further, since the assembling steps can be simplified, the efficiency of production of piezoelectric resonance parts can be greatly increased and the size effectively reduced.

Other features of the invention will become clear from the following description of embodiments.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 3 through 6 are perspective views for explaining the process for producing the piezoelectric resonator shown in FIG. 2, wherein FIG. 3 is a perspective view showing a piezoelectric ceramic parent base board formed with polarizing electrodes, FIG. 4 is a perspective view for explaining the process for slicing the piezoelectric ceramic parent base board, FIG. 5 is a perspective view showing a unit parent base board having insulating films formed on its opposite surfaces, and FIG. 6 is a perspective view showing the process for obtaining the piezoelectric resonator in the embodiment shown in FIG. 2 from the unit parent base board shown in FIG. 5;

FIGS. 12 through 14 are views showing the process of production of an example of a piezoelectric resonance part of this invention, wherein FIG. 12 is a perspective view of a case made of synthetic resin to be used, FIG. 13 is a perspective view of lead terminals, and FIG. 14 is a perspective view showing how the lead terminals and the piezoelectric resonator shown in FIG. 2 are assembled in the synthetic resin case;

DESCRIPTION OF THE PREFERRED EMBODIMENTS

This invention, as described above, relates to a piezoelectric resonator utilizing the longitudinal vibration mode, and to a piezoelectric resonance part with said piezoelectric resonator housed therein. They will now be described with reference to respective embodiments.

Figure 1:
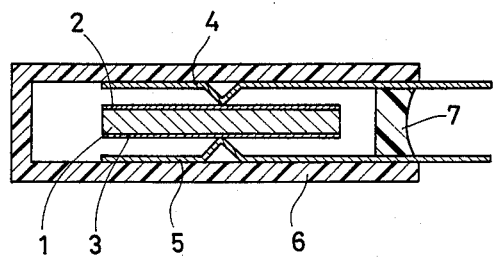
FIG. 1 is a sectional view showing an example of a conventional piezoelectric resonance part.
Figure 2:
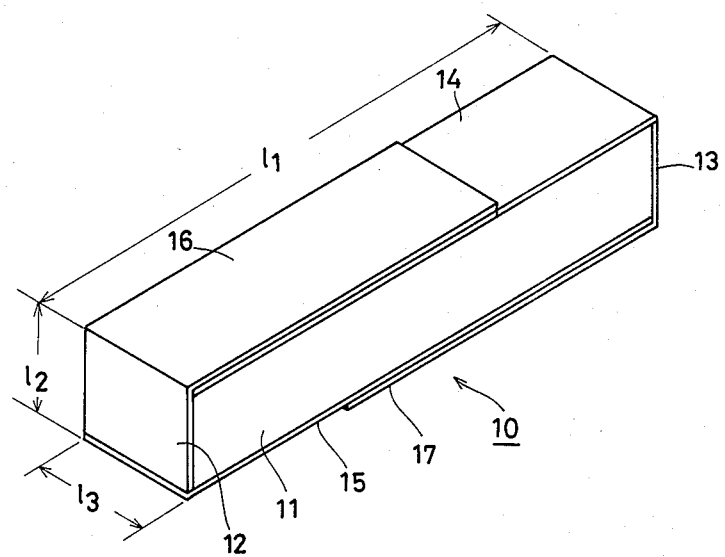
FIG. 2 is a perspective view of a first embodiment of a piezoelectric resonator.
Figure 3:
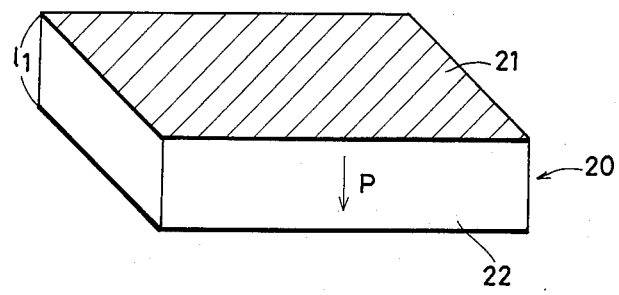
Figure 4:
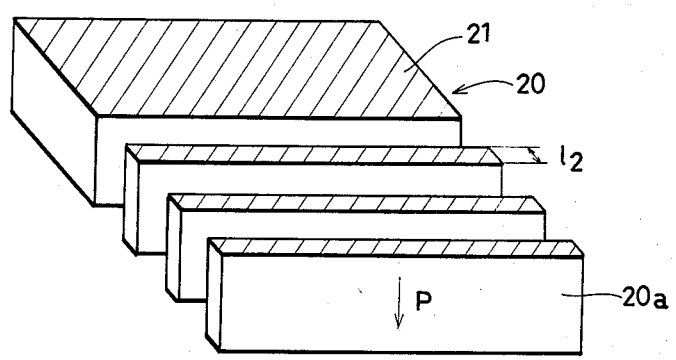

FIG. 2 is a perspective view showing a piezoelectric resonator according to a first embodiment of the invention. A piezoelectric resonator 10 utilizes the longitudinal vibration of a piezoelectric ceramic 11 and for this reason the lengthwise opposite ends of the piezoelectric ceramic 11 are formed with exciting electrodes 12 and 13. The resonator is so dimensioned that length $l_1 >>$ (thickness $l_2$, width $l_3$), thereby suppressing occurrence of unnecessary vibrations other than the intended longitudinal vibration. Up to this point, the arrangement is the same as a conventional piezoelectric resonator utilizing the longitudinal vibration mode. A structural feature of the invention is that the piezoelectric ceramic 11 includes insulating layers 14 and 15 formed on lengthwise extending surfaces thereof, the upper and lower surfaces in FIG. 2 in this embodiment, and a pair of take-out electrodes 16 and 17 covering said insulating layers 14 and 15 and connected to the exciting electrodes 12 and 13. If external lead terminals are soldered directly to the exciting electrodes 12 and 13 or spring terminals are elastically contacted therewith, since, in the longitudinal vibration mode, the piezoelectric ceramic 11 is longitudinally displaced, the vibration would be damped or electric characteristics would vary as the pressure of contact with the external terminals veries. In the resonator shown in FIG. 2, the take-out electrodes 16 and 17 to be connected to the external terminals are provided on the longitudinally extending surfaces where the displacement of the ceramic is small, so that they are connected to the exciting electrodes provided on the lengthwise opposite end surfaces. In addition, the insulating layers 14 and 15 formed under the take-out electrodes 16 and 17 serve to prevent formation of an electric field between the take-out electrodes 16 and 17, thereby precluding production of unnecessary vibrations. Therefore, said insulating layers may be formed only on the lower surface of the take-out electrodes.

Figure 5:
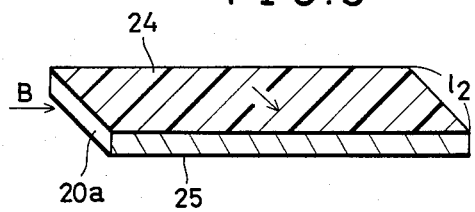
Figure 6:
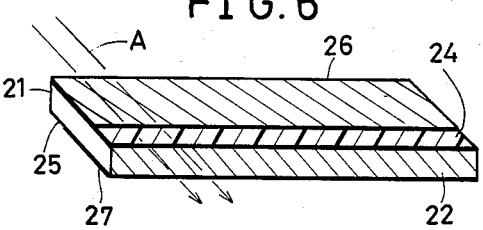

The production process for the embodiment shown in FIG. 2 will now be described with reference to FIGS. 3 through 7. First, as shown in a perspective view in FIG. 3, a piezoelectric ceramic parent base board 20 is prepared, formed on its main surfaces with polarizing electrodes 21 and 22, and polarized under high DC voltage in the direction of arrow P. Subsequently, as shown in a perspective view in FIG. 4, the piezoelectric ceramic parent base board 20 is sliced to a predetermined thickness (corresponding to the thickness $l_2$ of the piezoelectric resonator 10 in FIG. 2) to form unit parent base boards 20a. Each of the unit parent base boards 20a is then formed on its opposite surfaces with insulating layers 24 and 25, as shown in FIG. 5. Further, as shown in FIG. 6, the upper and lower surfaces of each unit parent base board 20a is formed with electrodes 26 and 27, which serve as the take-out electrodes, in such a manner as to cover portions of the insulating layers 24 and 25 and to connect to the remaining polarizing electrodes 21 and 22, whereupon it is cut as indicated by arrow A in FIG. 6, whereby the piezoelectric resonator shown in FIG. 2 is obtained. As is clear from FIGS. 6 and 7, the insulating layers 24 and 25 formed on the unit parent base board 20a serve as the insulating layers 14 and 15 on the resonator of this embodiment, the polarizing electrodes 21 and 22 serve as the exciting electrodes 12 and 13, and the electrodes 26 and 27 serve as the take-out electrodes 16 and 17.

The resonator in the embodiment shown in FIG. 2 can be obtained in the manner described above. The resonance frequency of this resonator is determined by the length $l_1$ and varies with the material and size of the resonator; when a lead zirconate titanate type piezoelectric ceramic is used, the resonance frequency is about $100/l_1$ (the unit of frequency is KHz and the unit of $l_1$ is mm). For the suppression of unnecessary vibrations and the increase of mechanical strength, the thickness $l_2$ and width $l_3$ shown in FIG. 2 are preferably such that $0.1 < (l_2, l_3) < 0.2$ (the units of $l_2$ and $l_3$ are mm). Further, the thickness $l_2$ and width $l_3$ may or may not equal to each other.

Figure 7:
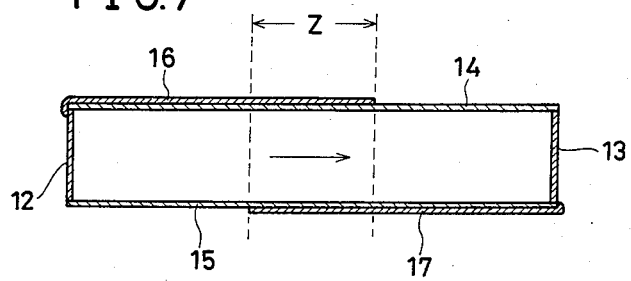
FIG. 7 is a sectional view of the embodiment shown in FIG. 2.

In addition, the connection of the external terminals to the take-out electrodes 16 and 17 can be made by soldering or by mechanical contact, but it is preferable that it be made in a region Z shown in FIG. 7. This is because, in the region Z located in the middle of the length of the piezoelectric resonator, the displacement is minimum and hence the connection to external terminals can be made more firmly.

Figure 8:
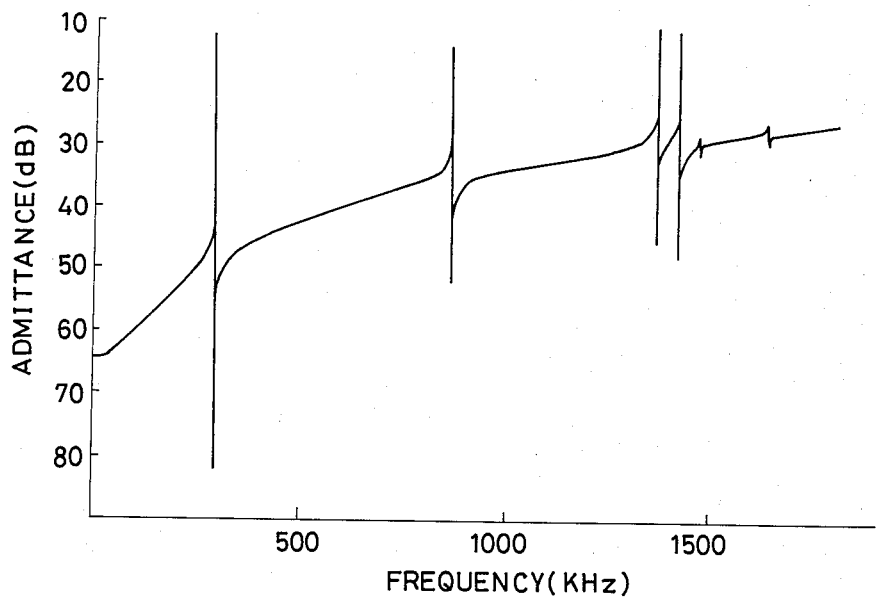
FIG. 8 is a graph showing the admittance-frequency characteristic of the embodiment shown in FIG. 2 when its insulating layers are removed.
Figure 9:
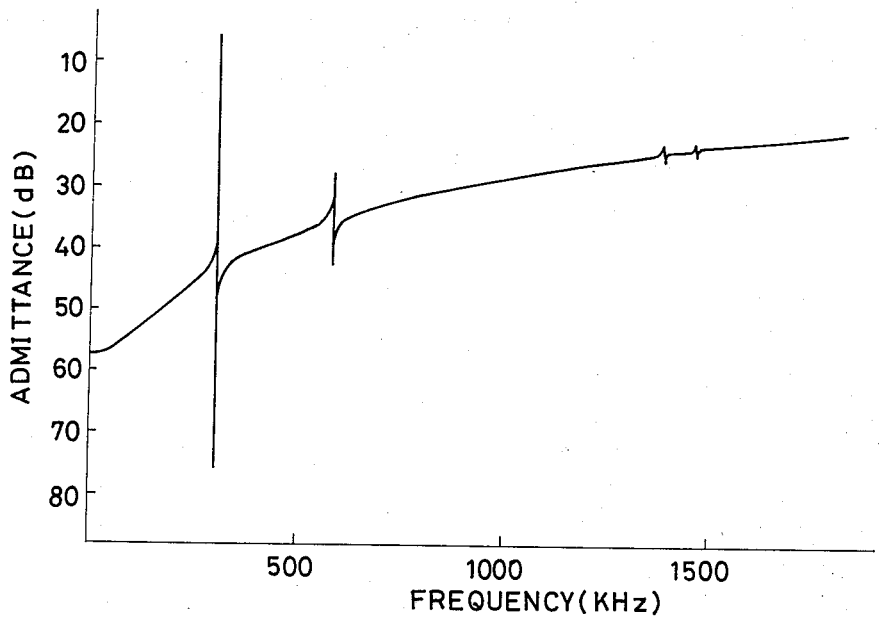
FIG. 9 is a graph showing the admittance-frequency characteristic of the embodiment shown in FIG. 2.

The characteristic of the embodiment shown in FIG. 2 will be described. In this embodiment, as described above, the insulating layers 14 and 15 are formed to prevent the take-out electrodes 16 and 17 from functioning as the exciting electrodes. The admittance-frequency characteristic obtained when said insulating layers 14 and 15 are not formed is shown in FIG. 8, while the admittance-frequency characteristic obtained when the insulating layers 14 and 15 are formed as in the embodiment shown in FIG. 2 is shown in FIG. 9. A comparison between FIGS. 8 and 9 reveals that the formation of the insulating layers 14 and 15 is very effective in suppressing unnecessary vibrations. In addition, the characteristic shown in FIG. 9 is one obtained where in FIG. 2 with length $l_1=6.7$ mm, thickness $l_2=$ width $l_3=0.96$ mm, thickness of insulating layers 14 and $15=25$ μm, and Z (see FIG. 7) $=1.0$ mm, external leads are soldered to the take-out electrodes 16 and 17. This element yielded such factors as resonance frequency $f_r=283.4$ KHz, antiresonance frequency $f_a=288.9$ KHz, $R_1=629\omega$, $R_a=2.3$ M$\omega$, $Cf=1.8$ pF, and $Q_m=1300$.

Further, a resonator for use at a frequency of 400 KHz was compared with a conventional resonator utilizing the expansive vibration; it was found that in the instance of a conventional circular or quadrangular board type resonator, the radius R or one side $l=5.25$ mm, the thickness $t=0.4$ mm and the volume was about 9.5–11.5 mm$^3$, whereas in the embodiment shown in FIG. 2 the length $l_1=5.25$ mm, the thickness $l_2=$ the width $l_3=0.7$ mm, and the volume was 2.6 mm$^3$. Therefore, it can be seen that the volume of the resonator is as small as about ¼ of that of the conventional one utilizing the expansive vibration.

Figure 10:
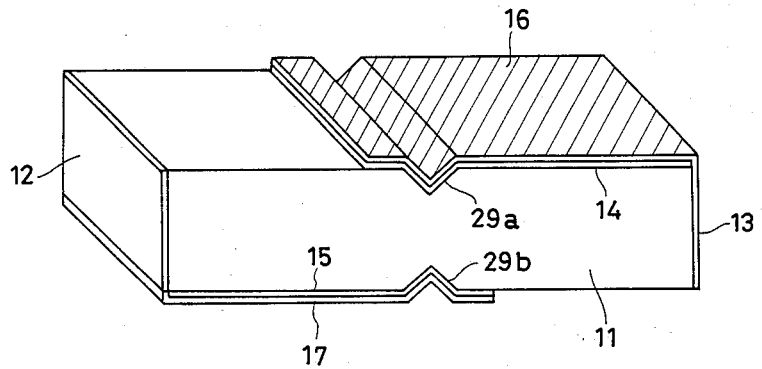
FIG. 10 is a perspective view of a second embodiment of a piezoelectric resonator of this invention.

FIG. 10 is a perspective view showing a second embodiment of the invention. This embodiment is characterized in that lengthwise extending surfaces of a piezoelectric ceramic 11, i.e., the upper and lower surfaces in FIG. 10 are formed with grooves 29a and 29b extending substantially at right angles to the direction of the length and in that insulating layers 14 and 15 and take-out electrodes 16 and 17 are formed to cover said grooves 29a and 29b. The rest of the arrangement is the same as in the embodiment shown in FIG. 2 and hence a description thereof will be omitted while adding corresponding reference numerals thereto.

Figure 11:
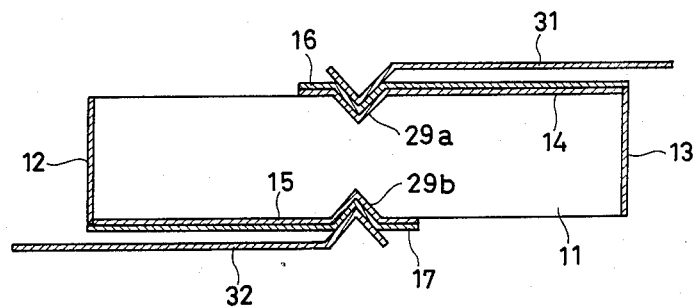
FIG. 11 is a sectional view for explaining the manner of connection of lead terminals to the embodiment shown in FIG. 10.

By forming the grooves 29a and 29b and using, in this embodiment, lead terminals 31 and 32 adapted to fit in the grooves 29a and 29b, as shown in FIG. 11, the state of connection of the lead terminals 31 and 32 to the take-out terminals 16 and 17 can be stabilized. Generally, it is preferable that the lead terminals 31 and 32 be contacted with the take-out electrodes 16 and 17 at a node of vibration. This is because the displacement is small there. Therefore, if the grooves 29a and 29b are formed in a region where a node of vibration of the piezoelectric resonator is present, a reliable resonator more resistant to shock can be obtained. It is to be pointed out that the aforesaid grooves 29a and 29b can be easily formed by performing a scribing operation using a dicing saw or the like in the direction of arrow B in the state of FIG. 5 showing the process of producing the embodiment shown in FIG. 2.

Figure 13:
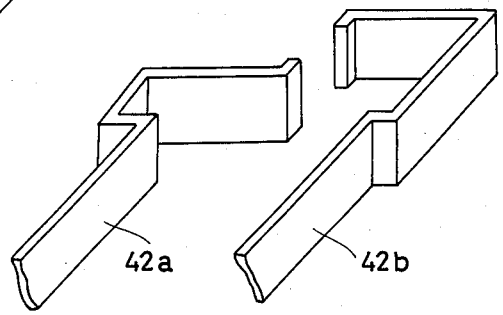
Figure 14:
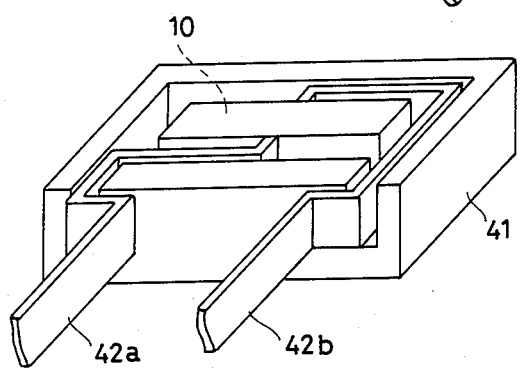

An embodiment of a piezoelectric resonance part having housed therein the piezoelectric resonator of the embodiment shown in FIG. 2 will now be described with reference to FIGS. 12 through 16. First, a synthetic resin inner case 41 as shown in a perspective view in FIG. 12 and lead terminals 42a and 42b as shown in FIG. 13 are prepared. The lead terminals 42a and 42b are then inserted into the inner case 41 through its open side, and the piezoelectric resonator 10 shown in FIG. 2 is inserted; thus, the parts are assembled as shown in a perspective view shown in FIG. 14. The upper side of the inner case 41 is open, and since the lead terminals 42a and 42b and resonator 10 to be received can be inserted through the open region, automatic assembly can be easily performed using an automatic inserting machine.

Figure 16:
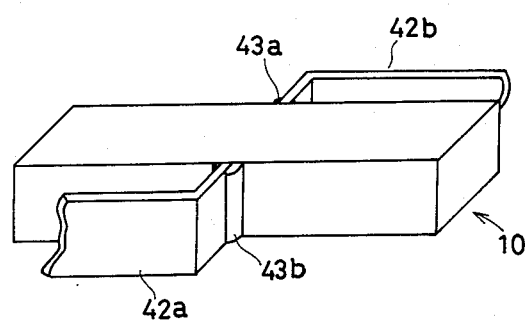
FIG. 16 is an enlarged perspective view showing regions where the lead terminals and piezoelectric resonator in the piezoelectric resonance part shown in FIG. 15 are connected.

In addition, in performing this assembly operation, preparatory solder or paste solder is applied in advance to the front ends of the lead terminals and the resonator 10 is inserted so that the front ends of the terminals 42a and 42b contact substantially the middle of the length of the resonator 10, whereupon the whole is heated as by a soldering iron or reflow to thereby soldering the lead terminals 42a and 42b to the take-out electrodes 16 and 17 (see FIG. 2). This soldered state is shown in an enlarged view in FIG. 16. In FIG. 16, reference numerals 43a and 43b denote soldering layers.

Figure 15:
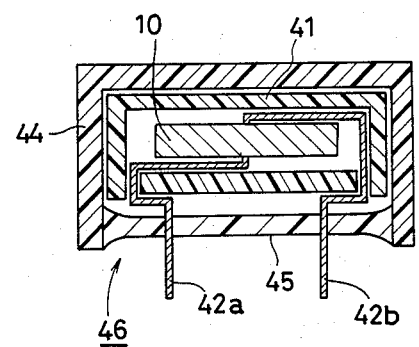
FIG. 15 is a sectional view of a piezoelectric resonance part produced through the process shown in FIGS. 12 through 14.

Subsequently, as shown in FIG. 15, an outer case 44 is fitted over the inner case 41, and the opening through which the lead terminals 42a and 42b are led out is sealed by a thermosetting resin 45, thereby providing a piezoelectric resonance part 46 according to any embodiment of the invention. The outer case 44 may be of any shape so long as it covers the upwardly opened portion of the inner case 41, but one which is shaped so that it fits from above is preferable. This is because it can be easily fitted by an automatic inserting machines.

With the piezoelectric resonance part of the embodiment shown in FIG. 15, since one side of the inner case 41 is opened wide, as described above, the assembly operation is very easy to perform and the positioning of the lead terminals 42a and 42b with respect to the inner case 41 can be reliably effected. Further, since the lead terminals 42a and 42b are soldered at their front ends to the resonator 10, the soldering area can be minimized and stabilized performance obtained. Further, if the dimension in the direction of the width (the direction of the width refers to the horizontal direction as viewed in FIG. 12) of the inner case 41 is adjusted in advance to the length of the longest of the piezoelectric resonators 10, such inner cases can be used with all sizes of piezoelectric resonators 10. Thus, even if a resonator 10 of different size having a different intended resonance frequency is used, the part can be produced using a case of the same shape and lead terminals 42a and 42b of the same pitch, so that efficiency of production can be greatly increased. Further, since the lead terminals 42a and 42b are fixed by soldering, there is not danger of the characteristics varying even if the part is subjected to a mechanical shock.

Figure 17:
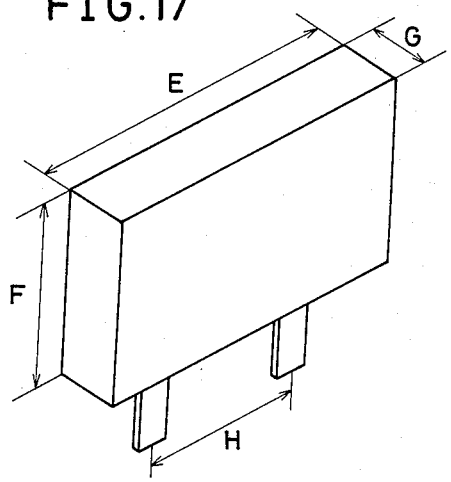
FIG. 17 is a perspective view of the piezoelectric resonance part shown in FIG. 15.
Figure 12:
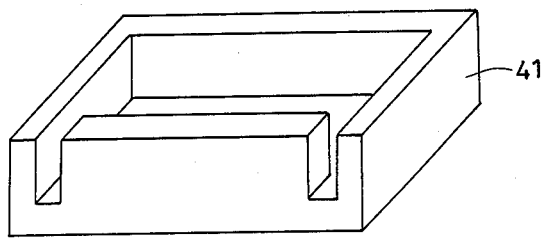

FIG. 17 is a perspective view showing the external appearance of the piezoelectric resonance part of the embodiment shown in FIG. 15. When a conventional article was compared with the piezoelectric resonance part of the embodiment shown in FIG. 15 on the basis of the dimension E, F, G and H, the result was as shown in a table below.

TABLE

| Symbol | Conventional Article (S) | Embodiment (T) | Ratio (T/S) |
|---|---|---|---|
| E | 13.5* | 14.0* | 1.04 |
| F | 14.5* | 6.0* | 0.41 |
| G | 3.8* | 3.0* | 0.79 |
| H | 10.0* | 5.0* | 0.5 |

*Unit is mm.

Figure 18:
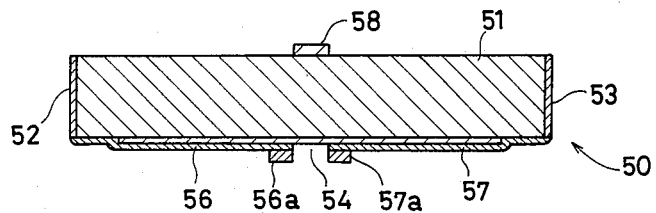
FIGS. 18 and 19 are a sectional view and a bottom view, respectively, of a third embodiment of a piezoelectric resonator of this invention.
Figure 19:
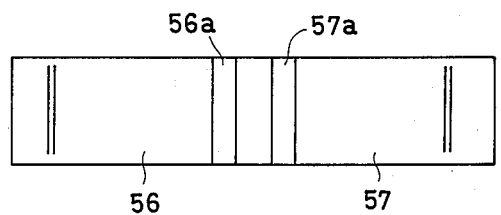

As is clear from the table, it is seen that the overall volume is as small as ⅓ of that of the conventional article. In addition, this conventional article uses a 200 KHz resonator. FIG. 18 is a sectional view showing a third embodiment of this invention, and FIG. 19 is a bottom view. This embodiment utilizes the longitudinal vibration mode of a piezoelectric ceramic 51, and the lengthwise opposite end surfaces of the piezoelectric ceramic 51 are formed with exciting electrodes 52 and 53. Up to this point, the arrangement is the same as in the embodiment shown in FIG. 2. In this embodiment, a longitudinally extending surface of the piezoelectric ceramic 51 is formed with an insulating layer 54, and take-out electrodes 56 and 57 are formed which cover the insulating layer 54 and whose opposite ends are connected to the exciting electrodes 52 and 53. Therefore, it is only necessary to form the insulating layer 54 on one surface alone. Further, the take-out electrodes 56 and 57 are lengthwise spaced from each other in the middle of the length of the resonator 50, and their front end portions are formed with thick film electrodes 56a and 57a by applying an electrically conductive point thereto. These thick film electrodes 56 and 57 are provided for contact with the external lead terminals.

On the other hand, the other main surface having no insulation layer formed thereon is provided in the middle of the length of the resonator 50 with an elastic member 58 of silicone rubber or the like. This elastic member 58 serves to prevent suppression of vibration in holding the piezoelectric resonator 50.

Figure 24:
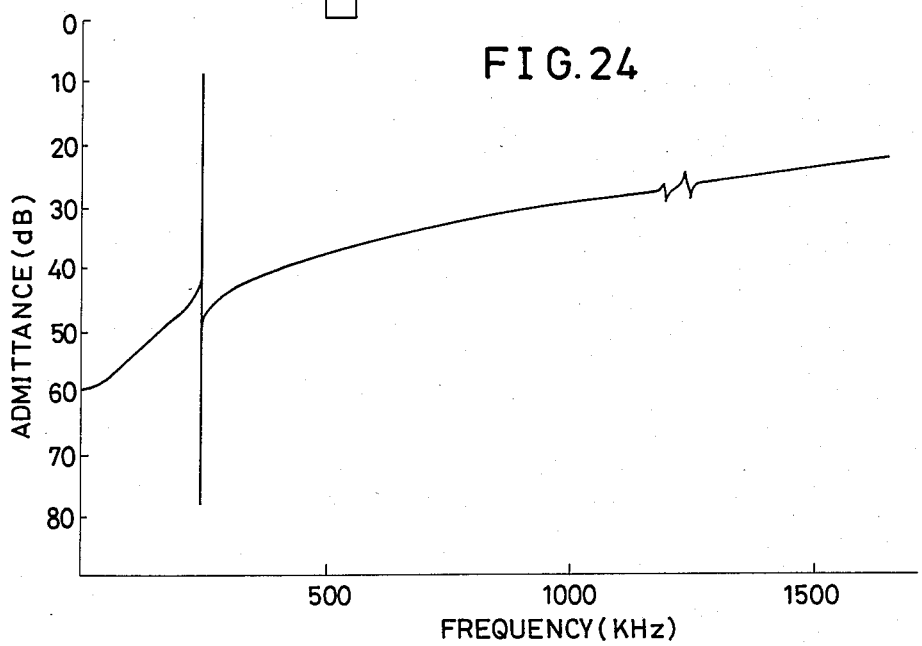
FIG. 24 is a graph showing the admittance-frequency characteristic of the embodiment shown in FIGS. 18 and 19.

Since the piezoelectric resonator 50 formed in the manner described above has no electrode opposed to the direction of the thickness of the piezoelectric ceramic 51, there is an advantage that no spurious component due to thickness slip vibration takes place. This will be clearly understood by comparing FIG. 24 showing the admittance-frequency characteristic of the resonator shown in FIGS. 18 and 19 with FIG. 9 showing the characteristic of the embodiment of FIG. 2. In addition, in FIG. 24, too, some spurious components are present, but they are believed to be due to parallel electric field excitation caused by the electric field between the take-out electrodes 56 and 57 leaking into the piezoelectric ceramic 51.

Figure 20:
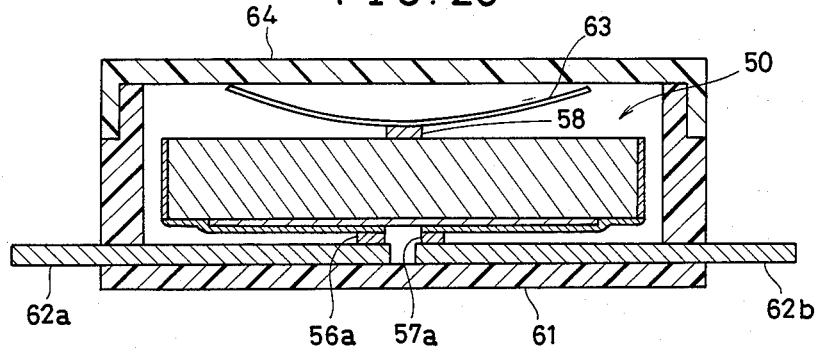
FIGS. 20 and 21 are a sectional view and a plan view, respectively, of a piezoelectric resonance part using the piezoelectric resonator shown in FIGS. 18 and 19.
Figure 21:
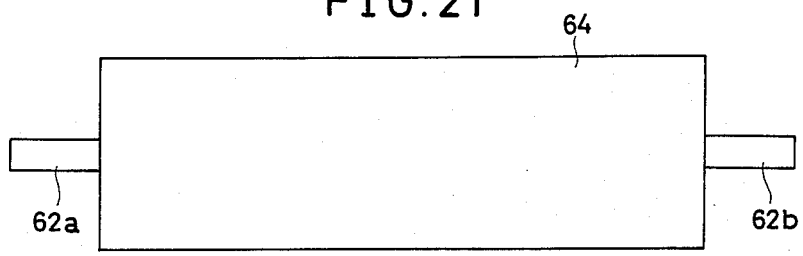

FIGS. 20 and 21 are a sectional view and a plan view, respectively, showing a second embodiment of a piezoelectric resonance part having housed therein the piezoelectric resonator of the embodiment shown in FIGS. 8 and 19. In this embodiment, a resin lower case 61 with lead terminals 62a and 62b integrally molded to be exposed outside is prepared. The front ends of the lead terminals 62a and 62b are spaced a predetermined distance apart from each other and will be contacted with the thick film electrodes 56a and 57a of the piezoelectric resonator 50 to be subsequently inserted. Further, after the piezoelectric resonator 50 has been inserted, a spring member made of metal is placed in contact with the top elastic member 58 and then a resin cap 64 is fitted over so as to depress the spring member 63. The lower case 61 and the cap 64 have an adhesive agent applied in advance to their contact surfaces, whereby they can be integrated. In this manner, the piezoelectric resonance part shown in FIGS. 20 and 21 can be obtained.

In the part shown in FIGS. 20 and 21, the elastic member 58 performs the functions of preventing excessive pressing of the resonator, absorbing a lead of vibration of the resonator 50 into the case 61 or cap 64, and ensuring that the pressing force of the spring member 63 acts correctly on the middle of the resonator 50.

In the piezoelectric resonance part shown in FIGS. 20 and 21, too, the same case 61, cap 64 and lead terminals 62a and 62b can be used for all the resonators if the case 61 and cap 64 are produced to agree with the longest of all piezoelectric resonators 50.

Further, as is clear from the construction shown in FIG. 20, it is very easy to make piezoelectric resonance parts in chip form. A model of the embodiment shown in FIG. 20 and 21 and adapted to operate at a frequency of 400 KHz was produced; the model measured 6.8 mm long, 3.0 mm wide, and 2.8 mm high. In contrast, a corresponding conventional resonance part in quadrangular form utilizing expansive vibration measures 7.9 mm long, 3.6 mm wide, and 9.3 mm high. Thus, it is seen that with the embodiment, the volume can be greatly reduced to as small as about 1/5 of that of the corresponding conventional article.

Figure 22:
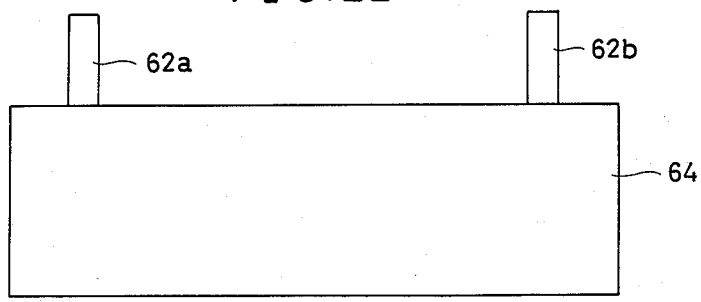
FIGS. 22 and 23 are plan views of modifications of the examples shown in FIG. 21, wherein the direction in which the lead terminals are withdrawn differs.
Figure 23:
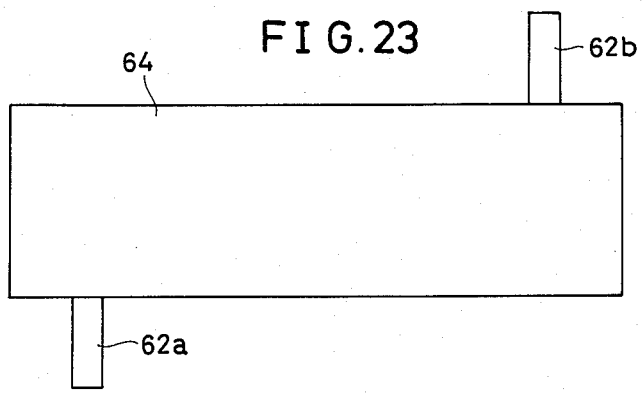

In addition, in the above embodiment, the lead terminals 62a and 62b have been led out of the case longitudinally of the piezoelectric resonator 50 in opposite directions; however, as shown in plan views in FIG. 22 and 23, for example, they may, of course, be led out at right angles to the direction of the length of the resonator or led out to the same side in a direction crossing the resonator.

In addition, in all the embodiment described so far, the piezoelectric ceramic has been shown as having a rectangular form; however, in this invention, it is not limited to a rectangular form, and piezoelectric ceramics of various forms such as a round bar may, of course, be used so long as the longitudinal vibration mode can be utilized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric resonator which uses the longitudinal vibration mode, comprising:
   a piezoelectric body polarized in a polarization direction, said piezoelectric body having lengthwise extending surfaces extending in said polarization direction between opposite ends, and opposite end surfaces at said opposite ends,
   exciting electrodes formed on said opposite end surfaces,
   insulating layers formed on at least portions of said lengthwise extending surfaces, and
   a pair of take-out electrodes covering at least portions of said insulating layers and connected to said exciting electrodes.

2. A piezoelectric resonator as in claim 1, wherein said lengthwise extending surfaces include two lengthwise extending surfaces which are opposite to each other and are connected at said opposite ends by said end surfaces.

3. A piezoelectric resonator as in claim 2, wherein the distance between said end surfaces is much greater than the distance between said two lengthwise extending surfaces.

4. A piezoelectric resonator which uses the longitudinal vibration mode, comprising:
   a piezoelectric body in the shape of a rectangular parallelepiped and having two opposite parallel, lengthwise extending surfaces extending in a lengthwise direction between opposite ends, two opposite parallel end surfaces at said opposite ends of said lengthwise extending surfaces and two side surfaces, said two lengthwise extending surfaces, said two end surfaces and said two side surfaces forming the six sides of the rectangular parallelepiped, said piezoelectric body being polarized in said lengthwise direction,
   two exciting electrodes formed on respective ones of said two end surfaces,
   insulating layers formed on said two lengthwise extending surfaces, and
   two take-out electrodes covering at least portions of said insulating layers on said two lengthwise extending surfaces and connected to respective ones of said two exciting electrodes.

5. A piezoelectric resonator as in claim 4, wherein the surfaces of said piezoelectric body on which the insulating layers and take-out electrodes are formed are provided with grooves extending in a direction crossing the lengthwise direction of said piezoelectric body, said insulating layers and take-out electrodes being formed to cover said grooves.

6. A piezoelectric resonator which uses the longitudinal vibration mode, comprising:
   a piezoelectric body in the shape of a rectangular parallelepiped and having two opposite parallel, lengthwise extending surfaces extending in a lengthwise direction between opposite ends, two opposite parallel end surfaces at said opposite ends of said lengthwise extending surfaces and two side surfaces, said two lengthwise extending surfaces, said two end surfaces and said two side surfaces forming the six sides of the rectangular parallelepiped, said piezoelectric body being polarized in said lengthwise direction,
   two exciting electrodes formed on respective ones of said two end surfaces,
   insulating layers formed on one of said two lengthwise extending surfaces, and
   two take-out electrodes covering at least portions of said insulating layers on said one of said two lengthwise extending surfaces and connected to respective ones of said two exciting electrodes.

7. A piezoelectric resonator as in claim 6, wherein the distance between said end surfaces is much greater than the distance between said two lengthwise extending surfaces and the distance between said two side surfaces.

8. A piezoelectric resonance part, comprising:
   a piezoelectric resonator which uses the longitudinal vibration mode, said resonator including:
   a piezoelectric body having lengthwise extending surfaces extending in a lengthwise direction between opposite ends, two opposite end surfaces at said opposite ends of said lengthwise extending surfaces, said piezoelectric body being polarized in said lengthwise direction,
   two exciting electrodes formed on respective ones of said two end surfaces,
   at least one insulating layer formed on at least portions of said lengthwise extending surfaces, and
   two take-out electrodes covering at least portions of said at least one insulating layer on said lengthwise extending surfaces and connected to respective ones of said two exciting electrodes;
   a case housing said piezoelectric resonator; and
   a pair of leads connected to respective ones of said take-out electrodes at substantially the lengthwise middles of said lengthwise surfaces, said leads extending out of said case.

9. A piezoelectric resonance part as in claim 8, wherein said at least one insulating layer and said take-out electrodes are formed on only one of said lengthwise extending surfaces of said piezoelectric body, and said leads extend to said opposite ends in said lengthwise direction and out of said case.

10. A piezoelectric resonance part as in claim 8, wherein said lengthwise extending surfaces include two lengthwise extending surfaces which are opposite to each other and are connected at said opposite ends by said end surfaces.

11. A piezoelectric resonance part as in claim 10, wherein said at least one insulating layer and said take-out electrodes are formed on said two lengthwise extending surfaces of the piezoelectric body, and said pair of leads are led out of said case from a same surface of said case and in a same direction.

12. A piezoelectric resonance parts as in claim 10, wherein the distance between said two end surfaces is much greater than the distance between said two lengthwise surfaces.

* * * * *